United States Patent
Liu et al.

(10) Patent No.: US 9,640,559 B2
(45) Date of Patent: May 2, 2017

(54) LOW TEMPERATURE POLY-SILICON ARRAY SUBSTRATE AND FORMING METHOD THEREOF

(71) Applicants: Xiamen Tianma Micro-Electronics Co., Ltd., Xiamen (CN); Tianma Micro-Electronics Co., Ltd., Shenzhen (CN)

(72) Inventors: Bozhi Liu, Xiamen (CN); Zaiwen Zhu, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/733,797

(22) Filed: Jun. 8, 2015

(65) Prior Publication Data

US 2016/0126258 A1    May 5, 2016

(30) Foreign Application Priority Data

Oct. 31, 2014    (CN) .......................... 2014 1 0604206

(51) Int. Cl.
*H01L 27/14* (2006.01)
*H01L 27/12* (2006.01)
*H01L 29/786* (2006.01)

(52) U.S. Cl.
CPC ........ *H01L 27/124* (2013.01); *H01L 27/1222* (2013.01); *H01L 27/1255* (2013.01); *H01L 27/1262* (2013.01); *H01L 29/78633* (2013.01)

(58) Field of Classification Search
CPC .................. H01L 27/1214; H01L 21/7687
USPC ............................................. 257/59, 72, 300
See application file for complete search history.

(56) References Cited

U.S. PATENT DOCUMENTS

| | | | |
|---|---|---|---|
| 6,927,809 B2* | 8/2005 | Gotoh ............... | G02F 1/136209 257/59 |
| 7,646,440 B2 | 1/2010 | Cheng et al. | |
| 7,790,526 B2* | 9/2010 | Tseng ................. | H01L 27/1255 257/59 |
| 7,952,551 B2* | 5/2011 | Kawata ................ | G09G 3/3648 345/90 |

* cited by examiner

*Primary Examiner* — Tan N Tran
(74) *Attorney, Agent, or Firm* — Alston & Bird LLP

(57) ABSTRACT

A low temperature poly-silicon (LTPS) array substrate is disclosed. The array substrate includes a first substrate and a stack structure on the first substrate, where the stack structure includes a first conductive layer, and a second conductive layer. The first and second conductive layers are insulated from each other. The array substrate also includes a polysilicon layer above the first and second conductive layers, an interlayer insulating layer above the polysilicon layer, and a source-drain metal layer on the interlayer insulating layer. The source-drain metal layer includes a source and a drain, the source and the drain are electrically connected with the polysilicon layer through a first via, and one of the source and the drain is electrically connected with the first conductive layer through a second via.

9 Claims, 18 Drawing Sheets

LOW TEMPERATURE POLY-SILICON ARRAY SUBSTRATE AND FORMING METHOD THEREOF

CROSS-REFERENCES TO RELATED APPLICATIONS

This application claims the benefit of priority to Chinese Patent Application No. 201410604206.5, filed with the Chinese Patent Office on Oct. 31, 2014 and entitled "LOW TEMPERATURE POLY-SILICON ARRAY SUBSTRATE AND FORMING METHOD THEREOF", the content of which is incorporated herein by reference in its entirety.

FIELD OF THE DISCLOSURE

The present disclosure generally relates to flat panel displaying technology, and more particularly, to a low temperature poly-silicon (LTPS) array substrate and a forming method thereof.

BACKGROUND OF THE INVENTION

LTPS thin-film transistor (TFT) liquid crystal display (LCD) has better performance than conventional amorphous silicon TFT LCD. For example, the LTPS TFT LCD can have an electron mobility greater than 200 $cm^2$/V-sec, which can help reducing a size of a TFT component, and further increasing its aperture ratio, i.e., increase the brightness of the TFT LCD. And the power consumption of the TFT LCD may be reduced. Besides, under the relatively high electron mobility, a portion of driving circuits can be integrated on a glass substrate, such that the number of integrated driving circuits may be reduced and the reliability of a LCD panel may be greatly enhanced, which may greatly reduce manufacturing cost of the LCD panel. Therefore, the LTPS TFT LCD has become a research focus gradually. Generally, an LTPS TFT LCD includes an array substrate and a color film substrate opposite to the array substrate.

In existing techniques, a metal layer of a storage capacitor or a pixel electrode may be enlarged to increase pixel capacitance, however, this may reduce an aperture ratio of pixels. Besides, in an existing pixel structure, the pixel capacitance consisting of a trench layer, a gate insulating layer and a first metal layer generally accounts for about 10% of the whole pixel capacitance, thus, increment of the area of the metal layer may not lead to obvious increment of the whole pixel capacitance.

BRIEF SUMMARY OF THE INVENTION

One inventive aspect is a low temperature poly-silicon (LTPS) array substrate. The array substrate includes a first substrate and a stack structure on the first substrate, where the stack structure includes a first conductive layer, and a second conductive layer. The first and second conductive layers are insulated from each other. The array substrate also includes a polysilicon layer above the first and second conductive layers, an interlayer insulating layer above the polysilicon layer, and a source-drain metal layer on the interlayer insulating layer. The source-drain metal layer includes a source and a drain, the source and the drain are electrically connected with the polysilicon layer through a first via, and one of the source and the drain is electrically connected with the first conductive layer through a second via.

BRIEF DESCRIPTION OF THE DRAWINGS

In order to clarify the objects, characteristics and advantages of the disclosure and related art, embodiments of present disclosure will be described in detail in conjunction with accompanying drawings of both the disclosure and related art. Obviously, the drawings are just examples and do not limit the scope of the disclosure, and other drawings may be obtained by a person skilled in the art based on these drawings without creative work.

DETAILED DESCRIPTION OF THE INVENTION

Embodiments of present disclosure will be described clearly in detail in conjunction with accompanying drawings. The embodiments below are only described for example, and there are many other possible embodiments. Based on the embodiments below, all the other embodiments obtained by those skilled in the art without any creative efforts should belong to the scope of the present disclosure.

Figure 1:
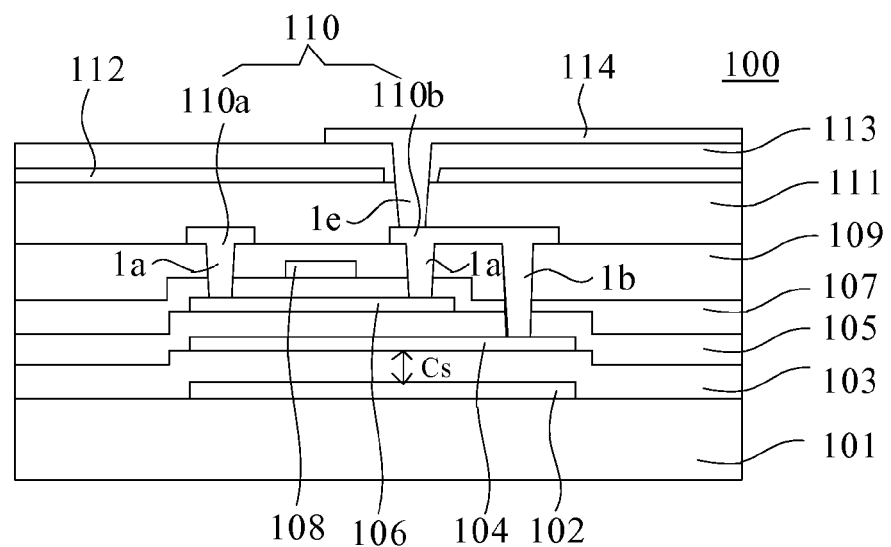
FIG. 1 schematically illustrates a sectional view of an LTPS array substrate according to an embodiment of the present disclosure.
Figure 2:
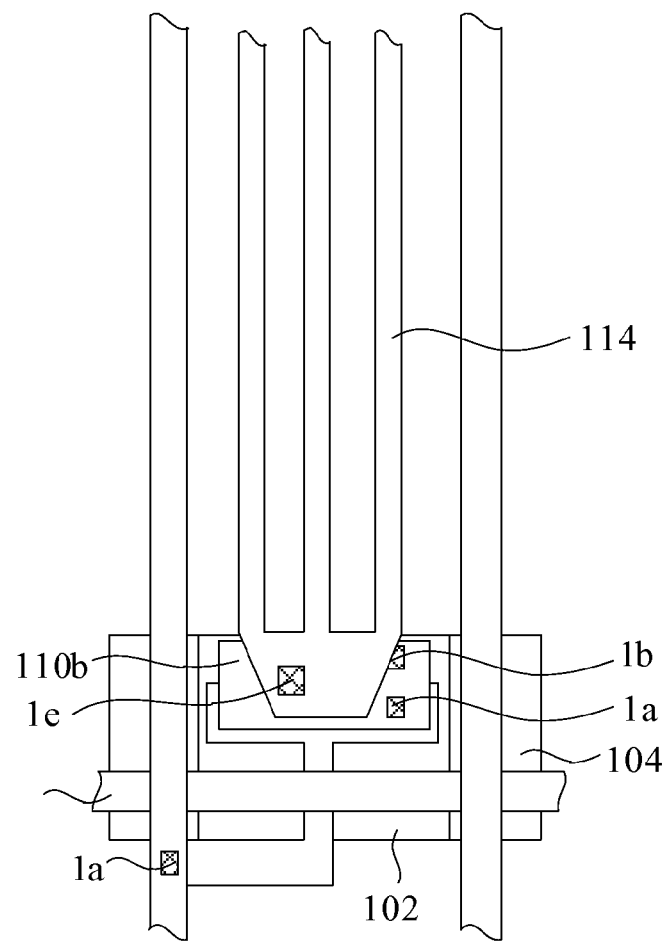
FIG. 2 schematically illustrates a vertical view of the LTPS array substrate in FIG. 1.

FIG. 1 schematically illustrates a sectional view of an LTPS array substrate 100 according to an embodiment of the present disclosure. FIG. 2 schematically illustrates a vertical view of the LTPS array substrate 100 in FIG. 1. Referring to FIG. 1, the LTPS array substrate 100 includes a first conductive layer 104 and a second conductive layer 102 which are insulated from each other and stacked on the first substrate 101. The second conductive layer 102 is disposed below the first conductive layer 104, and a first insulating layer 103 is disposed between the first conductive layer 104 and the second conductive layer 102 to cover the second conductive layer 102 and the first substrate 101. The first conductive layer 104, the second conductive layer 102 and the first insulating layer 103 constitute a storage capacitance Cs. The first conductive layer 104 has a rectangular shape which can be referred to FIG. 2. The second conductive layer 102 has a shape of strip and a same electric potential with a common electrode (not shown). At least one of the first and second conductive layers includes a material capable of blocking lights, such as molybdenum-aluminum alloy, chromium, molybdenum or other materials which is conductive and capable of blocking lights. The material capable of blocking lights can prevent light emitted by a backlight unit from irradiating a trench layer, which avoids extra produced current.

The LTPS array substrate 100 further includes a buffer layer 105 covering the first conductive layer 104 and the first insulating layer 103, which may prevent harmful subject in the first conductive layer 104 and the first insulating layer 103, such as, alkali metal ions, from impacting the performance of a polysilicon layer 106.

The LTPS array substrate 100 further includes the polysilicon layer 106 on the buffer layer 105. Different ion implantation regions may be formed on the polysilicon layer 106 by exposure, and ions are injected into the polysilicon layer 106, to form a trench region and a source-drain region. The polysilicon layer 106 overlaps with the projection of the first conductive layer 104 and the projection of the second conductive layer 102 in the vertical direction. In some embodiments, the projection of the first conductive layer 104 and the projection of the second conductive layer 102 in the vertical direction entirely cover the polysilicon layer 106, which may better block light emitted by a backlight unit to avoid extra produced current.

The LTPS array substrate 100 further includes a gate insulating layer 107 formed on the polysilicon layer 106. In some embodiments, the gate insulating layer 107 may include a dielectric material, such as a nitride-silicon compound or an oxygen-silicon compound.

The LTPS array substrate 100 further includes a gate 108 on the gate insulating layer 107. In some embodiments, the gate 108 may include a conductive material having a relatively low resistance, such as molybdenum-aluminum alloy, chromium or molybdenum. The gate 108 overlaps with the projection of the polysilicon layer 106, the projection of the first conductive layer 104 and the projection of the second conductive layer 102 in the vertical direction.

The LTPS array substrate 100 further includes a dielectric layer 109 on the gate 108, which covers the gate 108 and the gate insulating layer 107. In some embodiments, the dielectric layer 109 may include a dielectric material, such as a nitride-silicon compound or an oxygen-silicon compound. Two first vias 1a are formed to penetrate the dielectric layer 109 and the gate insulating layer 107 and to expose a portion of the polysilicon layer 106. A second via 1b is formed to penetrate the dielectric layer 109, the gate insulating layer 107 and the buffer layer 105, and to expose a portion of the first conductive layer 104.

The LTPS array substrate 100 further includes a source-drain metal layer 110 on the dielectric layer 109, including a source 110a and a drain 110b. It should be noted that, in some embodiments, the source 110a and the drain 110b may exchange, and the position relation is not limited to the embodiment shown in FIG. 1. The source 110a and the drain 110b are electrically connected with the polysilicon layer 106 through the first vias 1a, and the drain 110b is further electrically connected with the first conductive layer 104 through the second via 1b.

The LTPS array substrate 100 further includes a planarization layer 111 on the source-drain metal layer 110, which covers the dielectric layer 109, the source 110a and the drain 110b. In some embodiments, the planarization layer 111 may include an organic film. A first transparent electrode 112 is formed on the planarization layer 111. In some embodiments, the first transparent electrode 112 includes a transparent conductive material, such as ITO. A second insulating layer 113 is formed on the first transparent electrode 112, and a second transparent electrode 114 is formed on the second insulating layer 113. A third via 1e is formed, which penetrates the second insulating layer 113 and the planarization layer 111, and exposes a portion of the drain 110b. The second transparent electrode 114 is electrically connected with the drain 110b through the third via 1e. It should be noted that, in some embodiments, the first transparent electrode 112 is the common electrode and the second transparent electrode 114 is a pixel electrode. Under the actions of the first and second transparent electrodes, liquid crystals (not shown) are driven to roll over and further to display different brightness. Referring to FIG. 1, the first transparent electrode 112 is disposed below the second transparent electrode 114, and the first transparent electrode 112 is a flat plane structure in a LCD panel (not shown), that is, a displaying mode is a fringe-field-switching (FFS) mode. In some embodiments, the displaying mode may be an in-plane-switching (IPS) mode, under which mode, the first and second transparent electrodes may be disposed in one layer with an interval therebetween. In some embodiments, the displaying mode may be a twisted-nematic (TN) mode, under which mode, the first transparent electrode 112 may be disposed on a color filter (not shown) opposite to the LTPS array substrate 100, and the first and second transparent electrodes drive the rolling of liquid crystals together. In the embodiment in FIG. 1, the position of the first transparent electrode 112 is described by taking the FFS displaying mode for an example. It should be noted that, the position of the first transparent electrode 112 is not limited to the embodiment in FIG. 1.

From above, in FIG. 1, the first conductive layer 104 and the second conductive layer 102 are formed on the first substrate 101, which are insulated from each other and are stacked on the first substrate 101. The first conductive layer 104, the second conductive layer 102 and the first insulating layer 103 therebetween constitute a storage capacitance Cs. The storage capacitance Cs is disposed below a black matrix and has a relatively large area, thus, the storage capacitance Cs may account for about 50% of the whole pixel capacitance. That is, the storage capacitance Cs is increased at all possible without impacting an aperture ratio. Besides, in above embodiments, the common electrode (the second conductive layer 102) is formed under a conductive trench, which may shield the influence caused by exterior potential and avoid a startup of a back trench, so as to reduce a current leakage.

Figure 3:
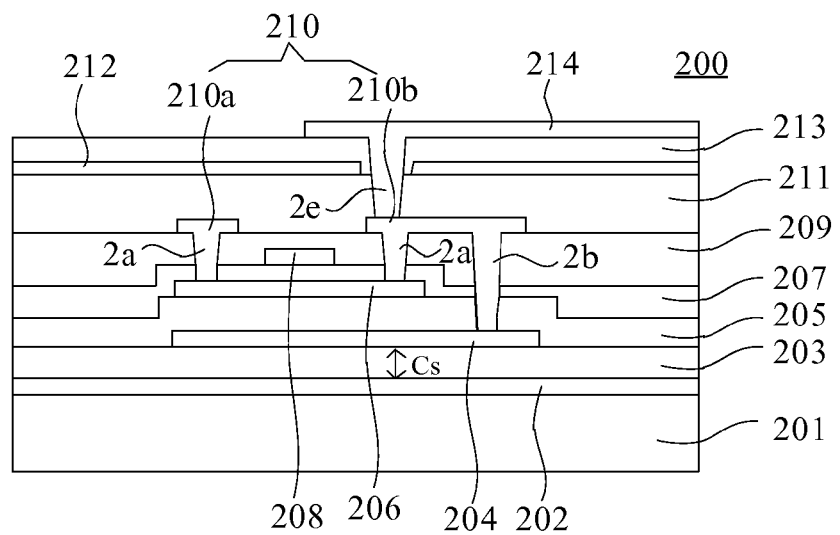
FIG. 3 schematically illustrates a sectional view of an LTPS array substrate according to an embodiment of the present disclosure.
Figure 4:
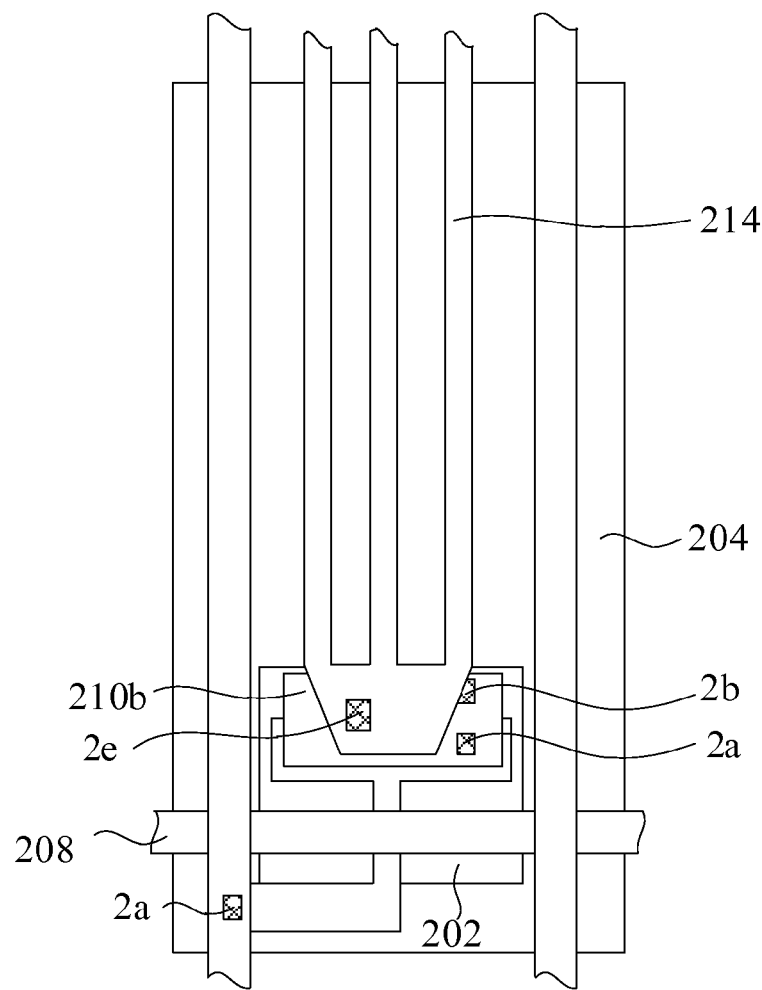
FIG. 4 schematically illustrates a vertical view of the LTPS array substrate in FIG. 3.

FIG. 3 schematically illustrates a sectional view of an LTPS array substrate 200 according to an embodiment of the present disclosure. FIG. 4 schematically illustrates a vertical view of the LTPS array substrate 200 in FIG. 3. The difference between the LTPS array substrate 100 in FIG. 1 and the LTPS array substrate 200 in FIG. 3 is that: a second conductive layer 202 has a flat plane shape and includes a transparent material, such as ITO, while the first conductive layer 204 has a rectangular shape and includes a material capable of blocking lights, such as molybdenum-aluminum alloy, chromium, molybdenum or other materials which is conductive and capable of blocking lights. The material capable of blocking lights can prevent light emitted by a backlight unit from irradiating a trench layer, which avoids extra produced current. Except the above difference, other parts of the two LTPS array substrates are similar, which can be referred to the above embodiments and are not described in detail here. Compared with the LTPS array substrate 100 in FIG. 1, advantages of the LTPS array substrate 200 in FIG. 2 lie in that, the second conductive layer 202 has the flat plane shape, thus, no etching process needs to be performed to the second conductive layer 202 during a forming method of the LTPS array substrate 200, which may reduce process steps and corresponding cost.

Figure 5:
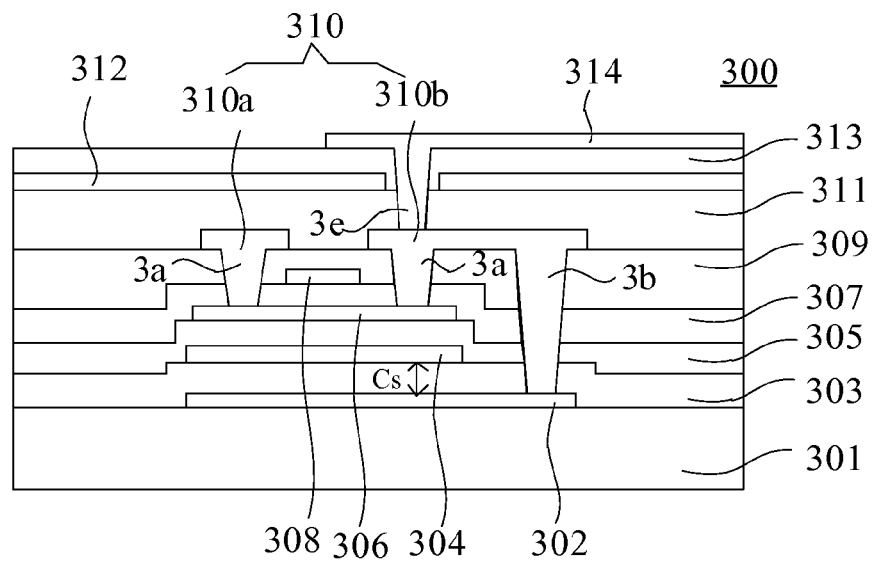
FIG. 5 schematically illustrates a sectional view of an LTPS array substrate according to an embodiment of the present disclosure.
Figure 6:
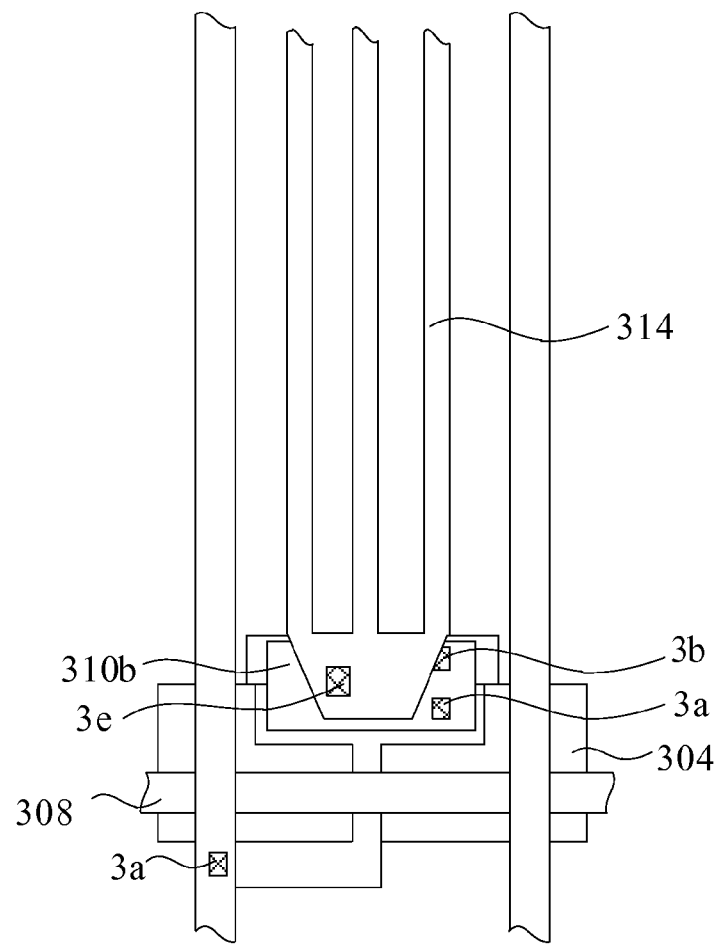
FIG. 6 schematically illustrates a vertical view of the LTPS array substrate in FIG. 5.

FIG. 5 schematically illustrates a sectional view of an LTPS array substrate 300 according to an embodiment of the present disclosure. FIG. 6 schematically illustrates a vertical view of the LTPS array substrate 300 in FIG. 5. Referring to FIG. 5, the LTPS array substrate 300 includes a first conductive layer 302 and a second conductive layer 304 which are insulated from each other and stacked on the first substrate 301. The second conductive layer 304 is disposed above the first conductive layer 302, and a first insulating layer 303 is disposed between the first conductive layer 302 and the second conductive layer 304 to cover the first conductive layer 302 and the first substrate 301. The first conductive layer 302, the second conductive layer 304 and the first insulating layer 303 constitute a storage capacitance Cs. The first conductive layer 302 has a rectangular shape which can be referred to FIG. 6. The second conductive layer 304 has a shape of strip and a same electric potential with a common electrode (not shown). At least one of the first conductive layer 302 and the second conductive layer 304 includes a material capable of blocking lights, such as molybdenum-aluminum alloy, chromium, molybdenum or other materials which is conductive and capable of blocking lights. The material capable of blocking lights can prevent light emitted by a backlight unit from irradiating a trench layer, which avoids extra produced current.

The LTPS array substrate 300 further includes a buffer layer 305 covering the second conductive layer 304 and the first insulating layer 303, which may prevent harmful subject in the second conductive layer 304 and the first insulating layer 303, such as, alkali metal ions, from impacting the performance of a polysilicon layer 306.

The LTPS array substrate 300 further includes the polysilicon layer 306. Different ion implantation regions may be formed on the polysilicon layer 306 by exposure, and ions are injected into the polysilicon layer 306, to form a trench region and a source-drain region. The polysilicon layer 306 overlaps with the projection of the first conductive layer 302 and the projection of the second conductive layer 304 in the vertical direction. In some embodiments, the projection of the first conductive layer 302 and the projection of the second conductive layer 304 in the vertical direction entirely cover the polysilicon layer 306, which may better block light emitted by a backlight unit to avoid extra produced current.

The LTPS array substrate 300 further includes a gate insulating layer 307 formed on the polysilicon layer 306. In some embodiments, the gate insulating layer 307 may include a dielectric material, such as a nitride-silicon compound or an oxygen-silicon compound.

The LTPS array substrate 300 further includes a gate 308 on the gate insulating layer 307. In some embodiments, the gate 308 may include a conductive material having a relatively low resistance, such as molybdenum-aluminum alloy, chromium or molybdenum. The gate 308 overlaps with the projection of the polysilicon layer 306, the projection of the first conductive layer 302 and the projection of the second conductive layer 304 in the vertical direction.

The LTPS array substrate 300 further includes a dielectric layer 309 on the gate 308, which covers the gate 308 and the gate insulating layer 307. In some embodiments, the dielectric layer 309 may include a dielectric material, such as a nitride-silicon compound or an oxygen-silicon compound. Two first vias 3a are formed to penetrate the dielectric layer 309 and the gate insulating layer 307 and to expose a portion of the polysilicon layer 306. A second via 3b is formed to penetrate the dielectric layer 309, the gate insulating layer 307, the buffer layer 105 and the first insulating layer 303, and to expose a portion of the first conductive layer 302.

The LTPS array substrate 300 further includes a source-drain metal layer 310 on the dielectric layer 309, including a source 310a and a drain 310b. It should be noted that, in some embodiments, the source 310a and the drain 310b may exchange, and the position relation is not limited to the embodiment shown in FIG. 5. The source 310a and the drain 310b are electrically connected with the polysilicon layer 306 through the first vias 3a, and the drain 310b is further electrically connected with the first conductive layer 302 through the second via 3b.

The LTPS array substrate 300 further includes a planarization layer 311 on the source-drain metal layer 310, which covers the dielectric layer 309, the source 310a and the drain 310b. In some embodiments, the planarization layer 311 may include an organic film. A first transparent electrode 312 is formed on the planarization layer 311. In some embodiments, the first transparent electrode 312 includes a transparent conductive material, such as ITO. A second insulating layer 313 is formed on the first transparent electrode 312, and a second transparent electrode 314 is formed on the second insulating layer 313. A third via 3e is formed, which penetrates the second insulating layer 313 and the planarization layer 311, and exposes a portion of the drain 310b. The second transparent electrode 314 is electrically connected with the drain 310b through the third via 3e. It should be noted that, in some embodiments, the first transparent electrode 312 is a common electrode and the second transparent electrode 314 is a pixel electrode. Under the actions of the first and second transparent electrodes, liquid crystals (not shown) are driven to roll over and further to display different brightness. Referring to FIG. 5, the first transparent electrode 312 is disposed below the second transparent electrode 314, and the first transparent electrode 312 is a flat plane structure in a whole LCD panel (not shown), that is, a displaying mode is an FFS mode here. In some embodiments, the displaying mode may be an IPS mode, under which mode, the first transparent electrode 312 and the second transparent electrode 314 may be disposed in one layer with an interval therebetween. In some embodiments, the displaying mode may be a TN mode, under which mode, the first transparent electrode 312 may be disposed on a color filter (not shown) opposite to the LTPS array substrate 300, and the first and second transparent electrodes drive the rolling of liquid crystals together. In the embodiment in FIG. 5, the position of the first transparent electrode 312 is described by taking the FFS displaying mode for an example. It should be noted that, the position of the first transparent electrode 312 is not limited to the embodiment in FIG. 5.

From above, in FIG. 5, the first conductive layer 302 and the second conductive layer 304 are formed on the first substrate 301, which are insulated from each other and are stacked on the first substrate 301. The first conductive layer 302, the second conductive layer 304 and the first insulating layer 303 therebetween constitute a storage capacitance Cs. The storage capacitance Cs is disposed below a black matrix and has a relatively large area, thus, the storage capacitance Cs may account for about 50% of the whole pixel capacitance. That is, the storage capacitance Cs is increased at all possible without impacting an aperture ratio. Besides, in above embodiments, the common electrode (the second conductive layer 304) is formed under a conductive trench, which may shield the influence caused by exterior potential and avoid a startup of a back trench, so as to reduce a current leakage.

Figure 7A:
FIGS. 7A to 7N schematically illustrate cross-sectional views of intermediate structures of a method for forming an LTPS array substrate according to an embodiment of the present disclosure.
Figure 7B:
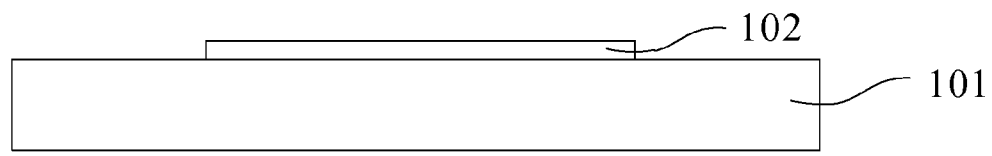
Figure 7C:
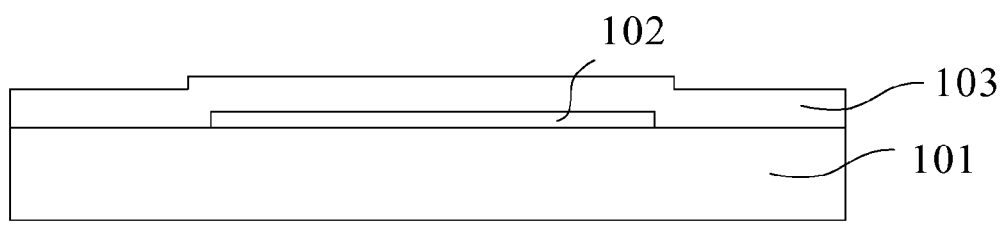
Figure 7D:
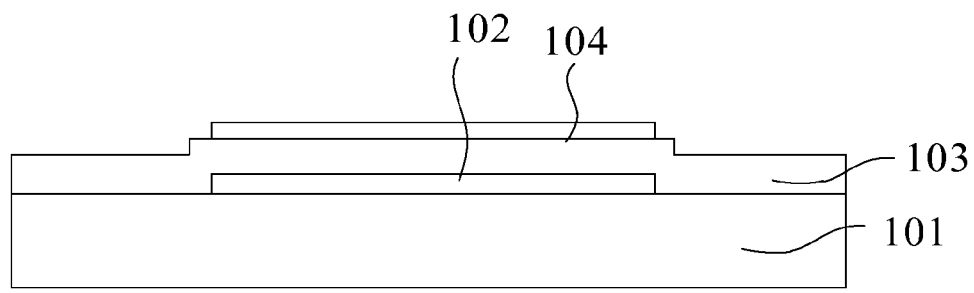
Figure 7E:
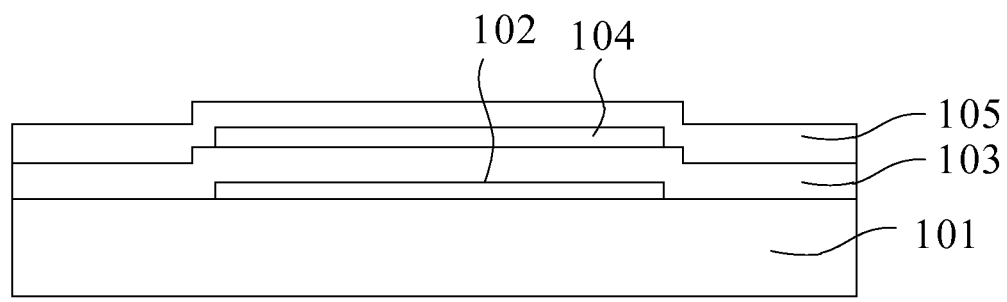
Figure 7F:
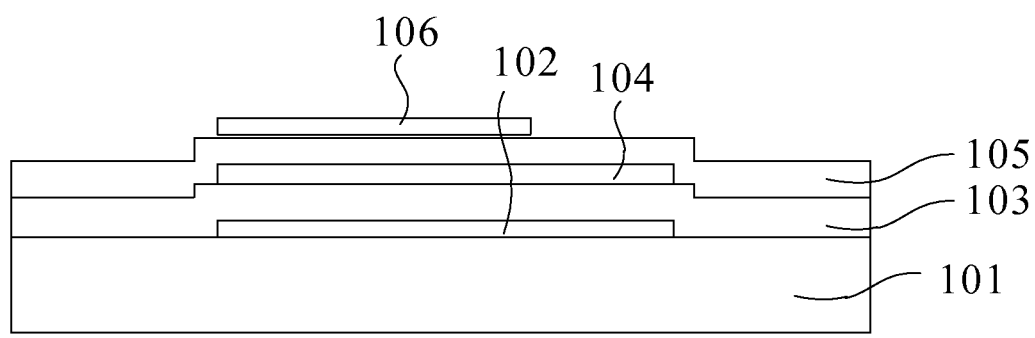
Figure 7G:
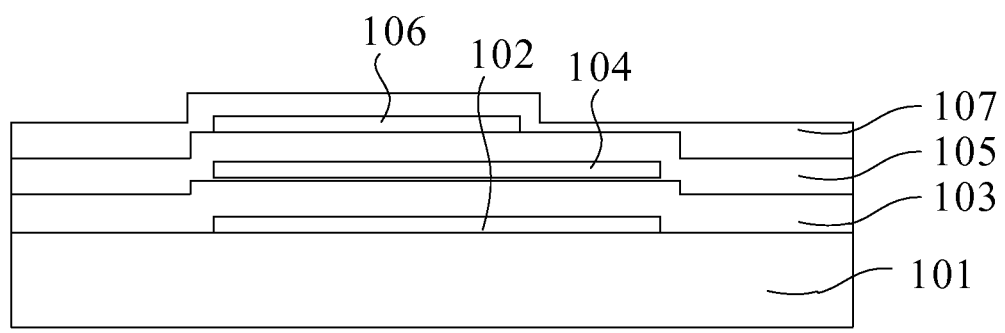
Figure 7H:
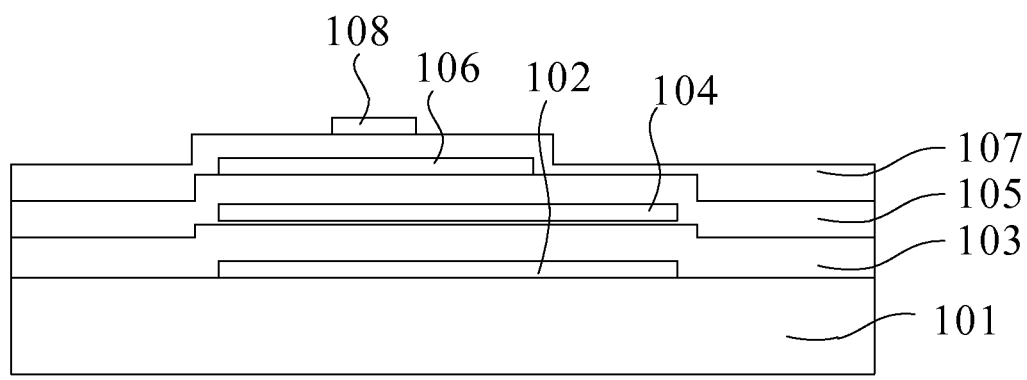
Figure 7I:
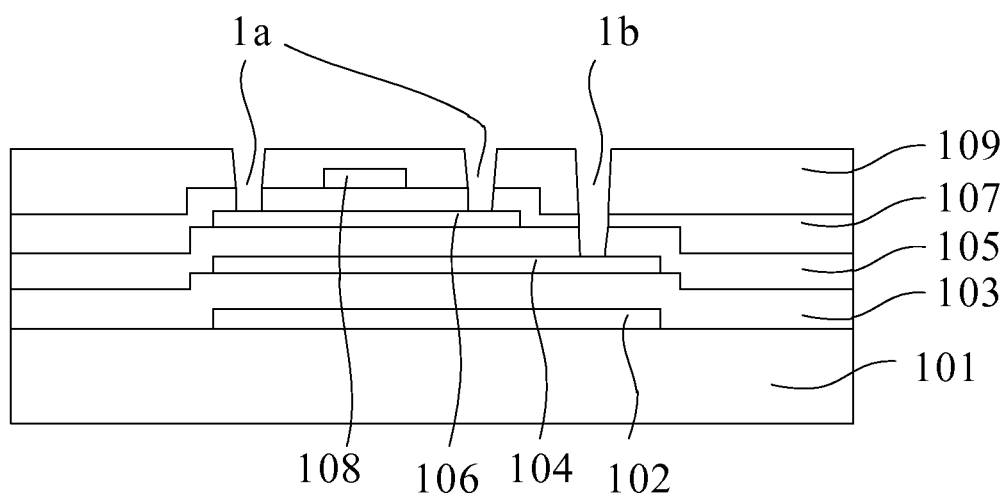
Figure 7J:
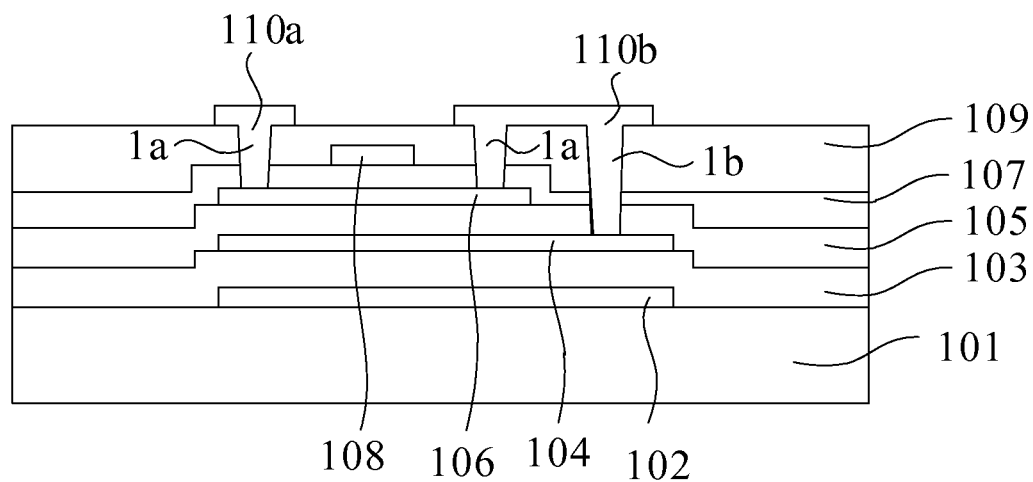
Figure 7K:
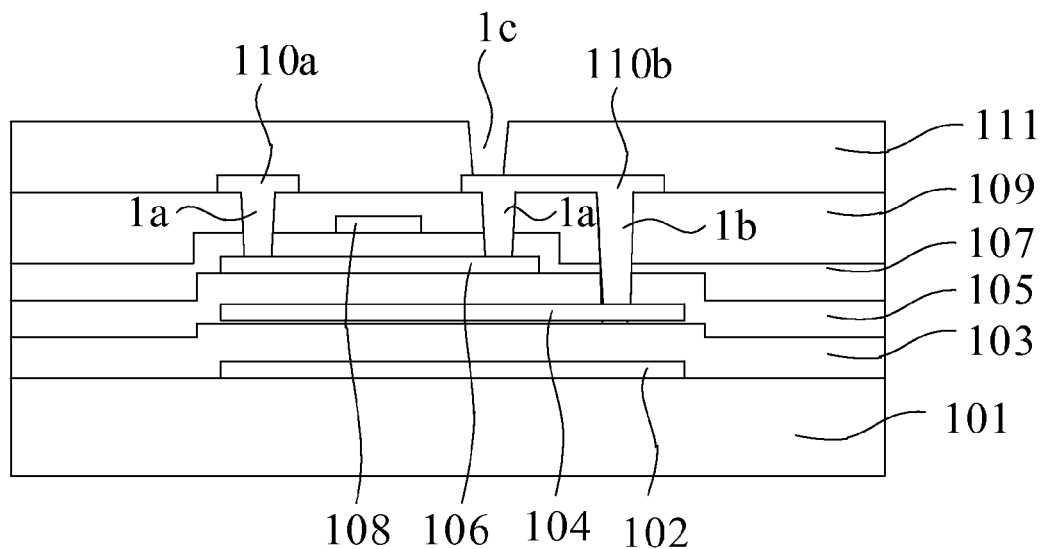
Figure 7L:
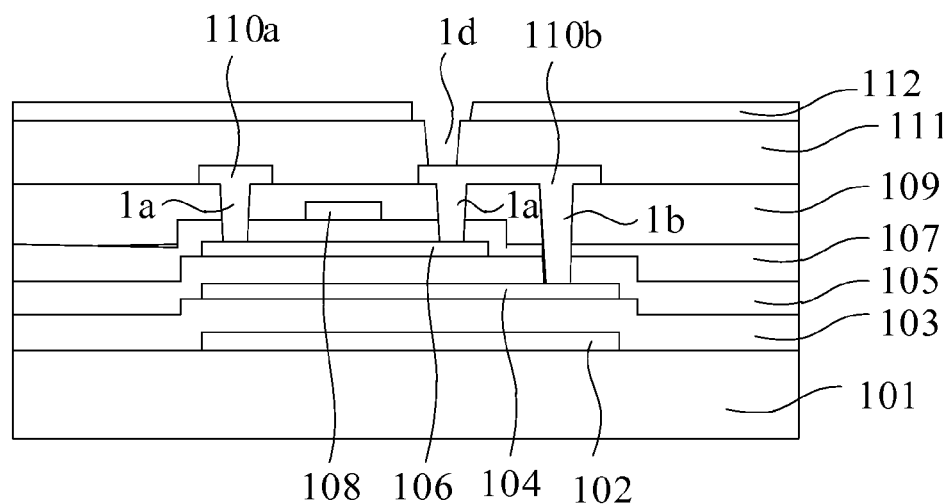
Figure 7M:
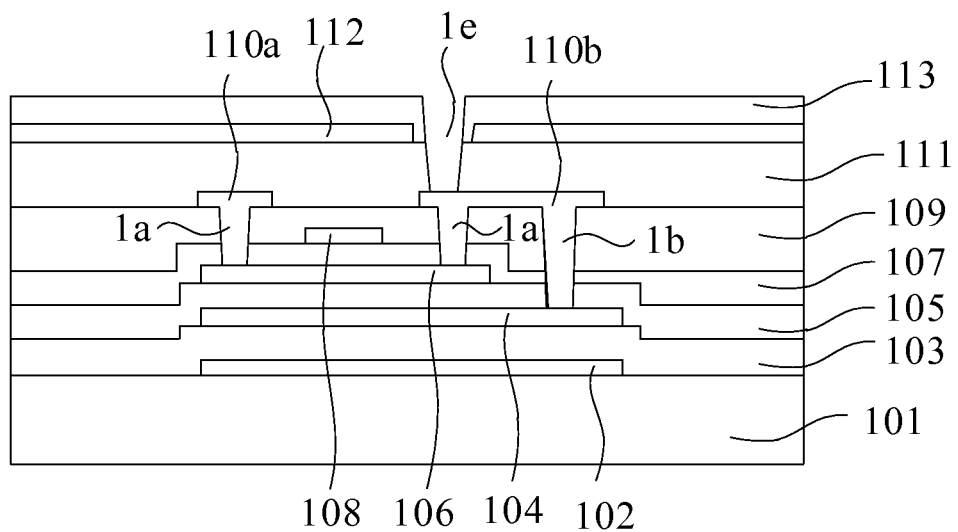
Figure 7N:
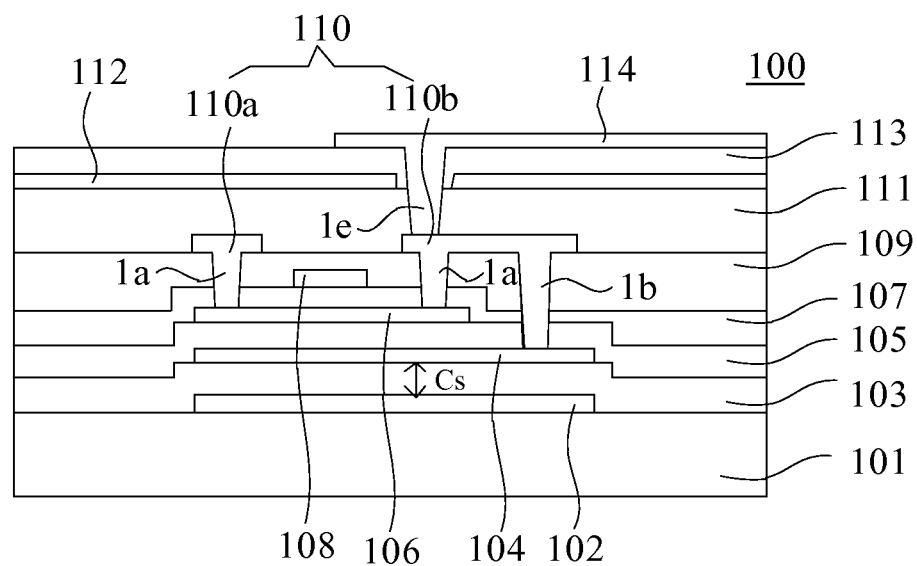

FIGS. 7A to 7N schematically illustrate cross-sectional views of intermediate structures of a method for forming an LTPS array substrate 100 according to an embodiment of the present disclosure.

Referring to FIG. 7A, a first substrate 101 is provided. In some embodiments, the first substrate 101 may be a transparent glass substrate. Referring to FIG. 7B, a second conductive layer 102 is formed on the first substrate 101, and is patterned. Referring to FIG. 7C, a first insulating layer 103 is formed on the second conductive layer 102 to cover the second conductive layer 102 and the first substrate 101. Referring to FIG. 7D, a first conductive layer 104 is formed on the first insulating layer 103, and is patterned. The first conductive layer 104 has a rectangular shape. The second conductive layer 102 has a shape of strip and a same electric potential with a common electrode. At least one of the first conductive layer 104 and the second conductive layer 102 includes a material capable of blocking lights, such as molybdenum-aluminum alloy, chromium, molybdenum or other materials which is conductive and capable of blocking lights. The material capable of blocking lights can prevent light emitted by a backlight unit from irradiating a trench layer, which avoids extra produced current. The projection of the second conductive layer 102 overlaps with the projection of the first conductive layer 104 on a vertical direction. The first conductive layer 104, the second conductive layer 102 and the first insulating layer 103 constitute a storage capacitance Cs.

Referring to FIG. 7E, a buffer layer 105 is formed on the first conductive layer 104 to cover the patterned first conductive layer 104 and the first insulating layer 103. A cleaning process may be performed before depositing the buffer layer 105. Afterwards, a plasma enhanced chemical vapor deposition (PECVD) process may be performed to form the buffer layer 105.

Referring to FIG. 7F, amorphous silicon is deposited on the buffer layer 105 by a PECVD process, to form an amorphous silicon layer. In some embodiments, a high-temperature roaster may be used to perform a dehydrogenation process to the amorphous silicon layer, which may avoid hydrogen explosion during a crystallization process and reduce an inner defect density of a thin film after the crystallization process. After the dehydrogenation process, an LTPS process may be performed. Specifically, some crystallization methods, such as an excimer laser annealer (ELA) process, a metal induced crystallization (MIC) process or a solid phase crystallization (SPC) process, may be performed to the amorphous silicon layer to form a polysilicon layer on the buffer layer 105. Afterwards, different ion implantation regions may be formed on the polysilicon layer by exposure, and ions are injected into the polysilicon layer, to form a trench region and a source-drain region. Afterwards, the polysilicon layer is photoetched, to form a patterned polysilicon layer 106 on the buffer layer 105. The polysilicon layer 106 overlaps with the projection of the first conductive layer 104 and the projection of the second conductive layer 102 in the vertical direction. In some embodiments, at least one of the first conductive layer 104 and the second conductive layer 102 (opaque layers) entirely covers the polysilicon layer 106 in the vertical direction.

Referring FIG. 7G, a gate insulating layer 107 is formed on the patterned polysilicon layer 106 by a PECVD process, wherein the gate insulating layer 107 covers the patterned polysilicon layer 106 and the buffer layer 105. In some embodiments, the gate insulating layer 107 may include a dielectric material, such as a nitride-silicon compound or an oxygen-silicon compound. Referring to FIG. 7H, a gate metal layer is formed on the gate insulating layer 107 by a sputtering process, and a photoetching process is performed to the gate metal layer to form a gate 108 on the gate insulating layer 107. In some embodiments, the gate 108 may include a conductive material having a relatively low resistance, such as molybdenum-aluminum alloy, chromium or molybdenum. The gate 108 overlaps with the projection of the polysilicon layer 106, the projection of the first conductive layer 104 and the projection of the second conductive layer 102 in the vertical direction.

Referring to FIG. 7I, a dielectric layer 109 is formed on the gate 108 by a PECVD process, wherein the dielectric layer 109 covers the gate 108 and the gate insulating layer 107. In some embodiments, the dielectric layer 109 may include a dielectric material, such as a nitride-silicon compound or an oxygen-silicon compound. Two first vias 1a are formed by a dry etching process. The first vias 1a penetrate the dielectric layer 109 and the gate insulating layer 107, and expose a portion of the patterned polysilicon layer 106. A second via 1b is formed, which penetrates the dielectric layer 109, the gate insulating layer 107 and the buffer layer 105, and exposes a portion of the patterned first conductive layer 104.

Referring to FIG. 7J, a source-drain metal layer 110 is formed on the dielectric layer 109 by a sputtering process, and a photoetching process is performed on the source-drain metal layer 110 to form a source 110a which fills one first via 1a and a drain 110b which fills the other first via 1a and the second via 1b. The source-drain metal layer 110 may include a conductive material having a relatively low resistance, such as molybdenum-aluminum alloy, chromium or molybdenum. The source 110a and the drain 110b are electrically connected with the polysilicon layer 106 through the first vias 1a, and the drain 110b is further electrically connected with the first conductive layer 104 through the second via 1b. It should be noted that, in some embodiments, the source 110a and the drain 110b may exchange, and the position relation is not limited to FIG. 7J.

Referring to FIG. 7K, a planarization layer 111 is formed on the source 110a and the drain 110b, which covers the dielectric layer 109, the source 110a and the drain 110b. In some embodiments, the planarization layer 111 may include an organic film. A fourth via 1c whose position corresponds to that of the drain 110b is formed in the planarization layer 111. The fourth via 1c penetrates the planarization layer 111 and exposes a portion of the drain 110b. In some embodiments, an area of the fourth via 1c is greater than or equal to an area of the first via 1a which is filled with the drain 110b.

Referring to FIG. 7L, a first transparent electrode 112 is formed on the planarization layer 111 and etched to form a fifth via 1d whose position corresponds to that of the fourth via 1c and which exposes a portion of the planarization layer 111 and a portion of the drain 110b.

Referring to FIG. 7M, a second insulating layer 113 which serves as a protective layer is formed on the first transparent electrode 112 and in the fifth via 1d and the fourth via 1c by a PECVD process. In some embodiments, the second insulating layer 113 may have silicon nitride. Afterwards, a third via 1e which penetrates the second insulating layer 113 and the planarization layer 111 is formed by a dry etching process. The third via 1e exposes the drain 110b.

Referring to FIG. 7N, a second transparent electrode 114 is formed on the second insulating layer 113 and in the third via 1e by a sputtering process. The second transparent electrode 114 is connected with the drain 110b through the third via 1e, to form a pixel electrode.

Based on above steps, the LTPS array substrate 100 shown in FIG. 7N is formed. In the LTPS array substrate 100, the first conductive layer 104 and the second conductive layer 102 are formed on the first substrate 101, which are insulated from each other and stacked on the first substrate 101. The first conductive layer 104, the second conductive layer 102 and the first insulating layer 103 therebetween constitute the storage capacitance Cs. The storage capacitance Cs is disposed below a black matrix and has a relatively large area, thus, the storage capacitance Cs may account for about 50% of the whole pixel capacitance. That is, the storage capacitance Cs is increased at all possible without impacting an aperture ratio. Besides, in above embodiments, the common electrode (the second conductive layer 102) is formed under a conductive trench, which may shield the influence caused by exterior potential and avoid a startup of a back trench, such that a current leakage is reduced.

Figure 8A:
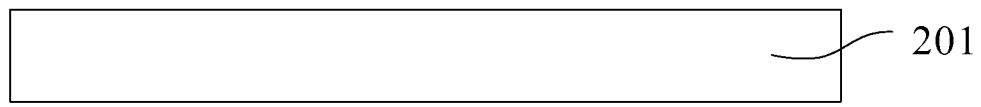
FIGS. 8A to 8N schematically illustrate cross-sectional views of intermediate structures of a method for forming an LTPS array substrate according to an embodiment of the present disclosure.
Figure 8B:
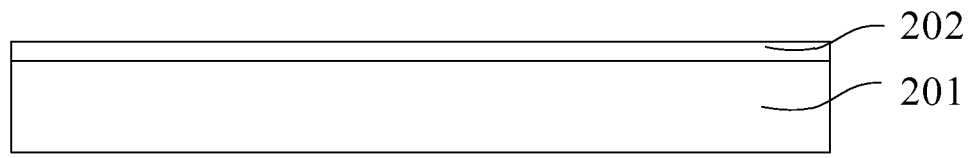
Figure 8C:
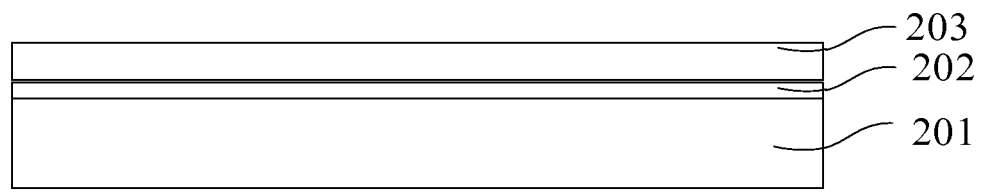
Figure 8D:
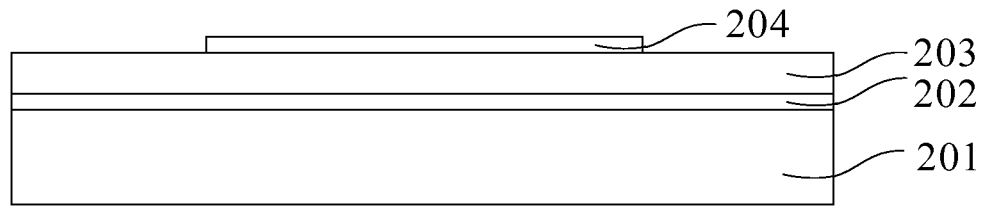
Figure 8E:
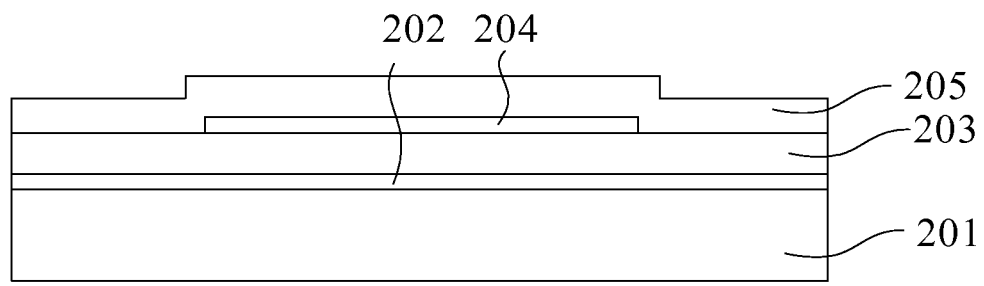
Figure 8F:
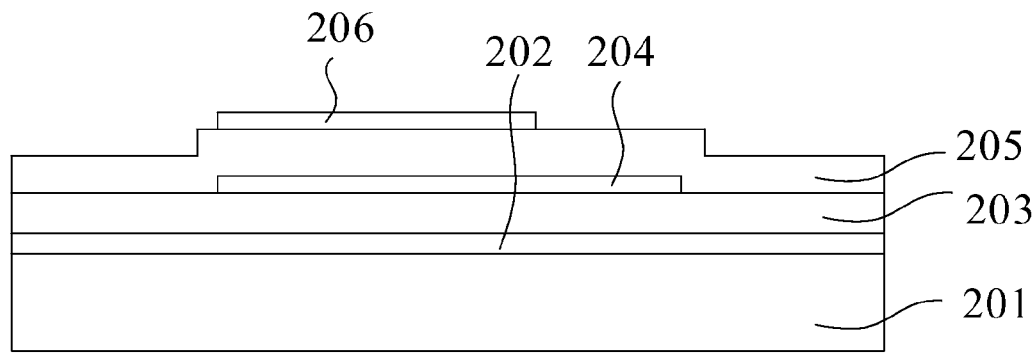
Figure 8G:
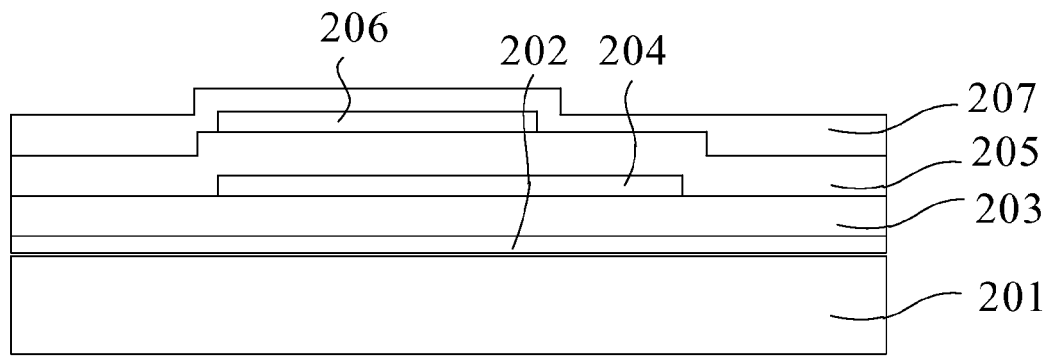
Figure 8H:
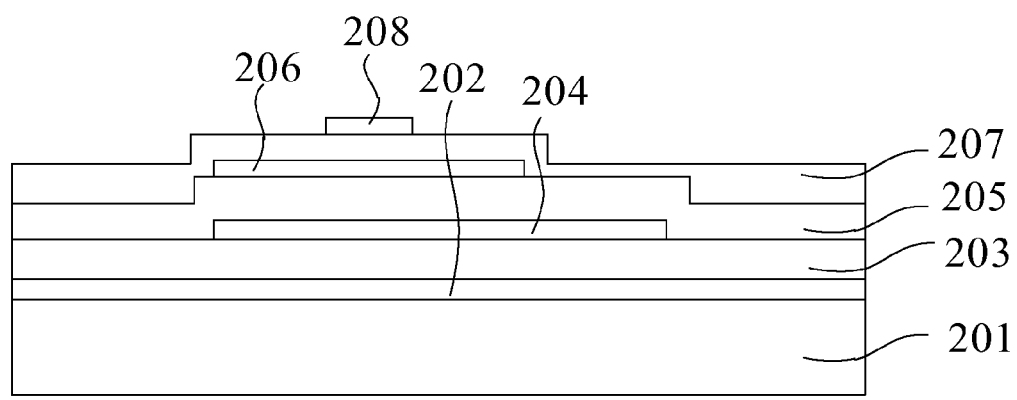
Figure 8I:
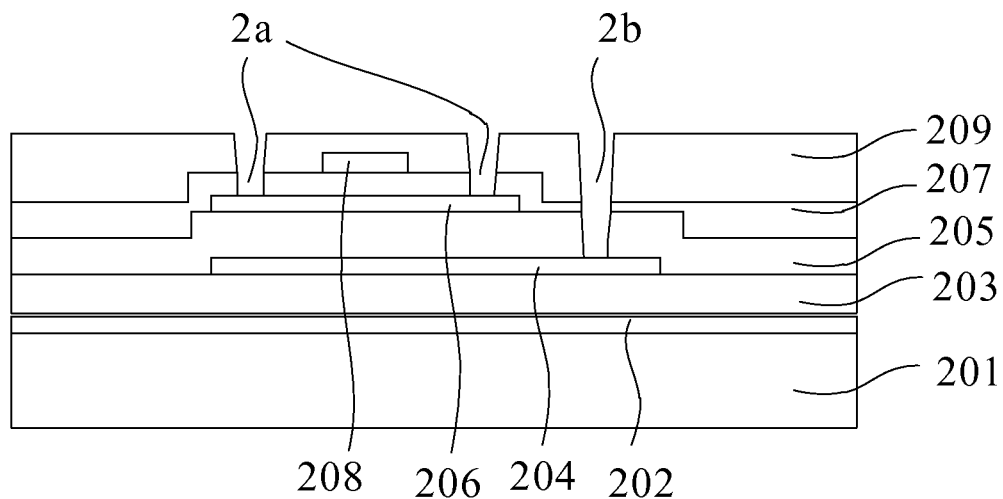
Figure 8J:
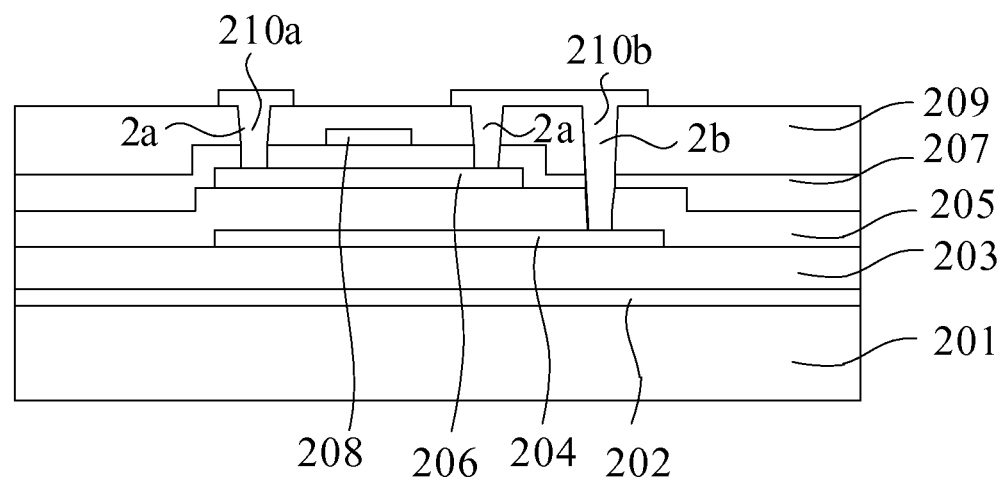
Figure 8K:
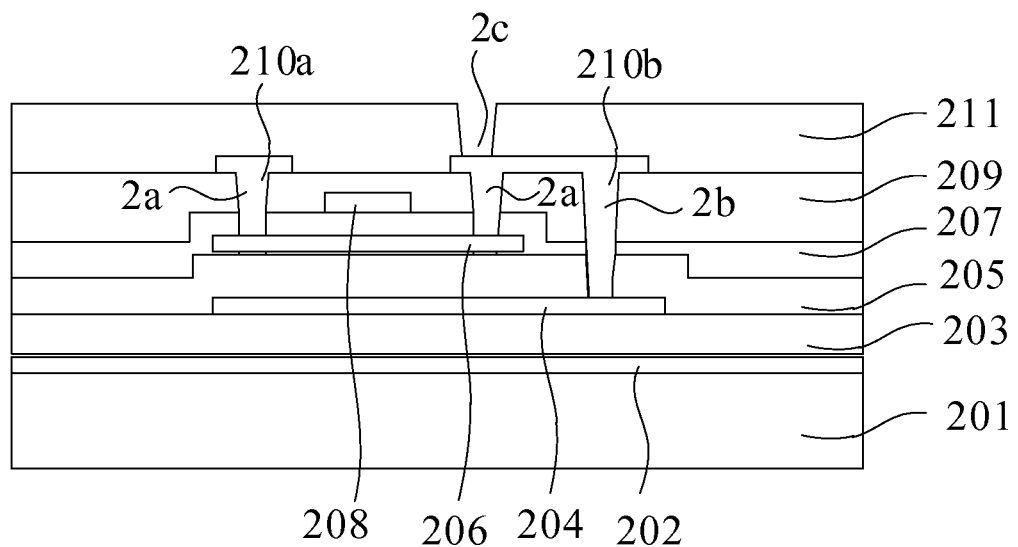
Figure 8L:
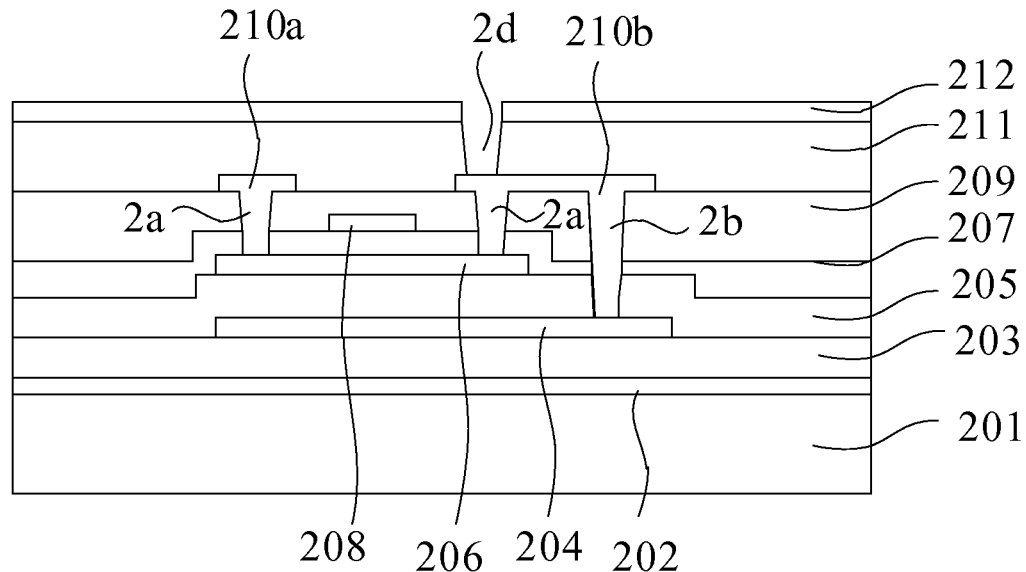
Figure 8M:
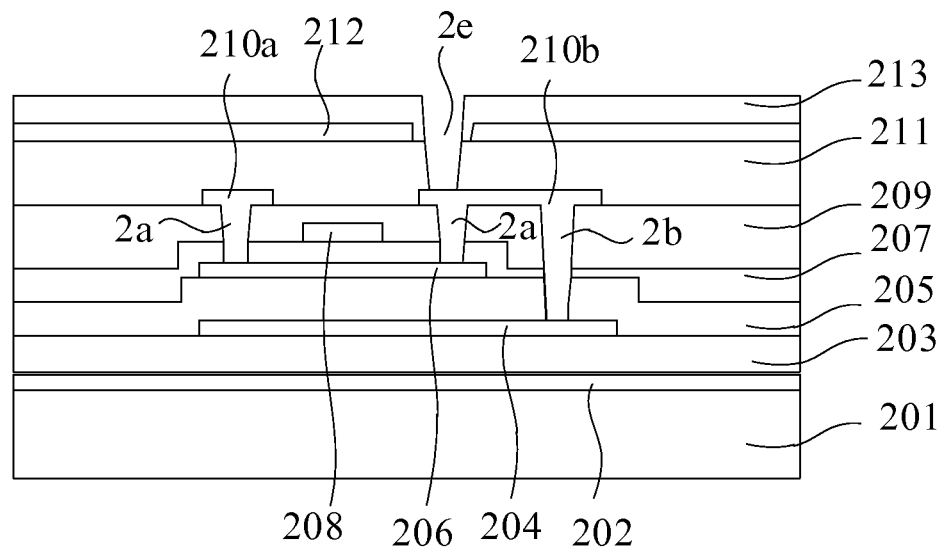
Figure 8N:
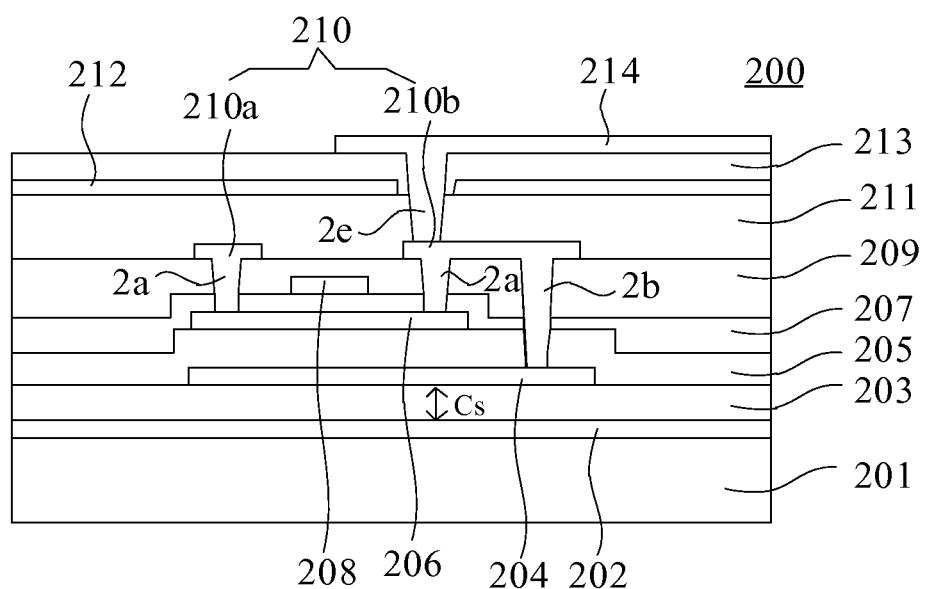

FIGS. 8A to 8N schematically illustrate cross-sectional views of intermediate structures of a method for forming an LTPS array substrate 200 according to an embodiment of the present disclosure. The difference between the method in FIGS. 8A to 8N and the method in FIGS. 7A to 7N is that: referring to FIG. 8B, after the second conductive layer 202 is formed on the first substrate 201, the second conductive layer 202 is not patterned and remains intact. In the embodiment, the second conductive layer 202 includes a transparent conductive material, such as indium tin oxide (ITO). The first conductive layer 204 has a rectangular shape and includes a material capable of blocking lights, such as molybdenum-aluminum alloy, chromium, molybdenum or other materials which is conductive and capable of blocking lights. The material capable of blocking lights can prevent light emitted by a backlight unit from irradiating a trench layer, which avoids extra produced current. Except the above difference, other parts of the two methods are similar, which can be referred to the above embodiments and are not described in detail here. Compared with the method in FIGS. 7A to 7N, advantages of the method in FIGS. 8A to 8N lie in that, no patterning process is performed to the second conductive layer 102, which may reduce one time of masking process and corresponding cost.

Figure 9A:
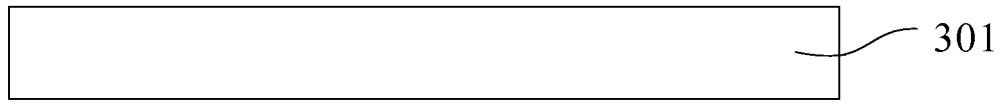
FIGS. 9A to 9N schematically illustrate cross-sectional views of intermediate structures of a method for forming an LTPS array substrate according to an embodiment of the present disclosure.
Figure 9B:
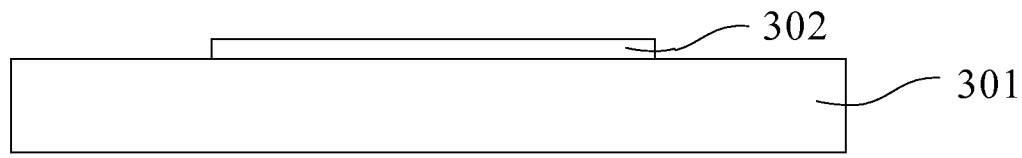
Figure 9C:
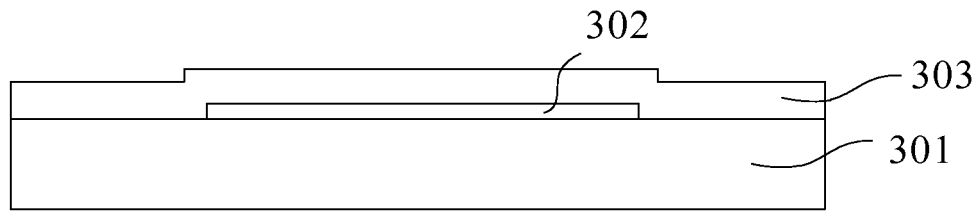
Figure 9D:
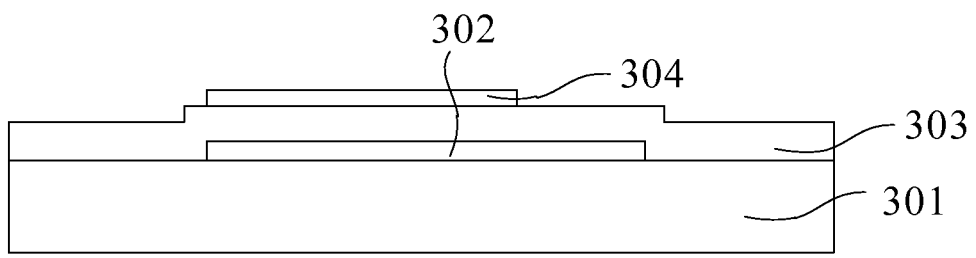
Figure 9E:
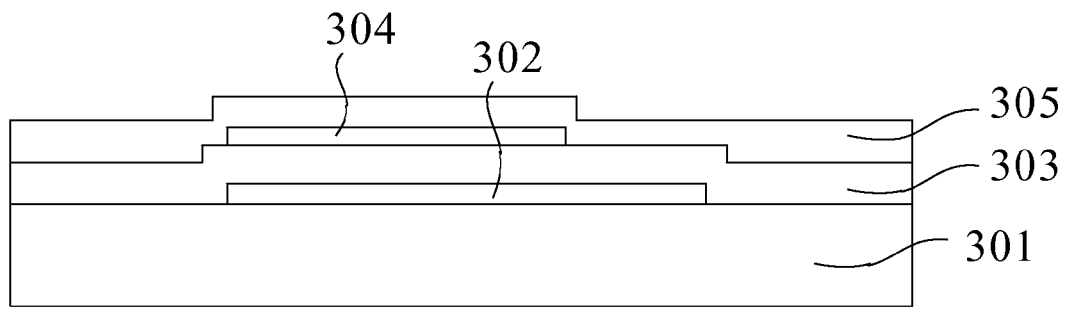
Figure 9F:
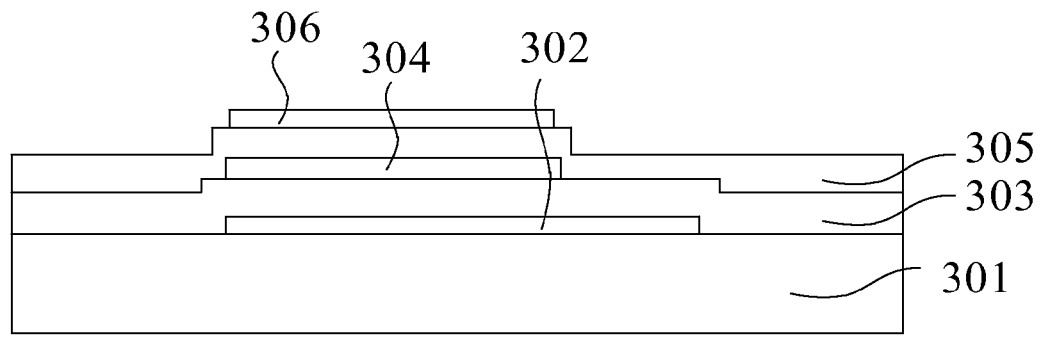
Figure 9G:
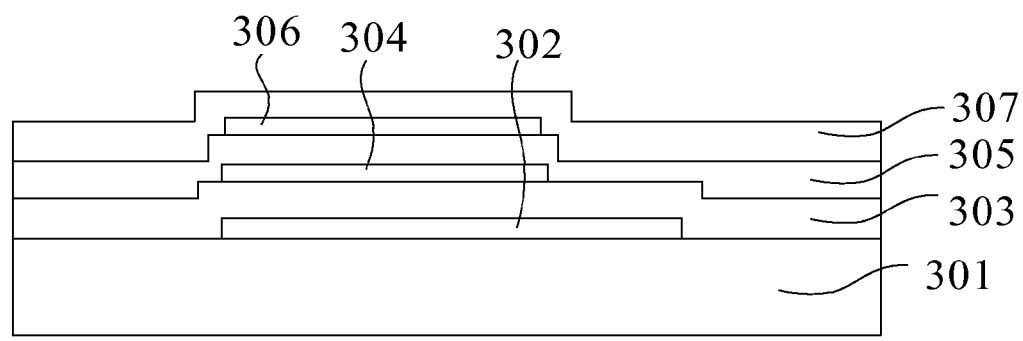
Figure 9H:
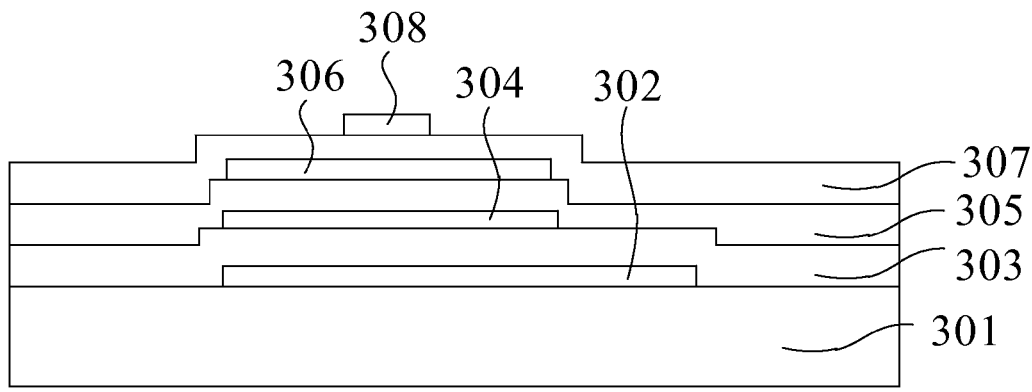
Figure 9I:
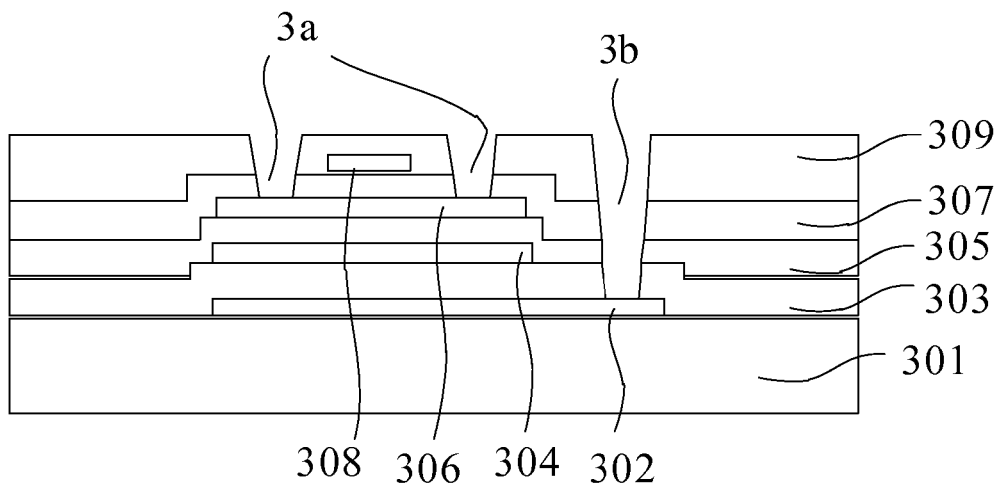
Figure 9J:
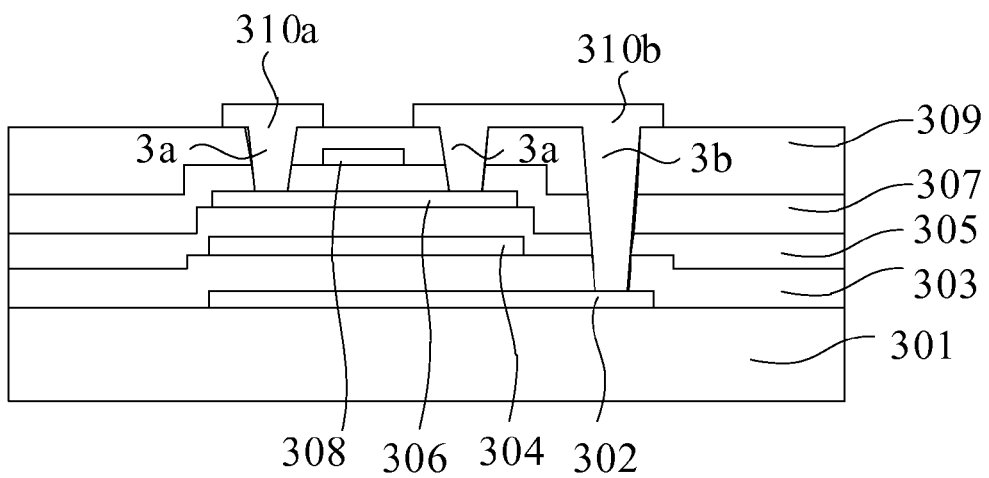
Figure 9K:
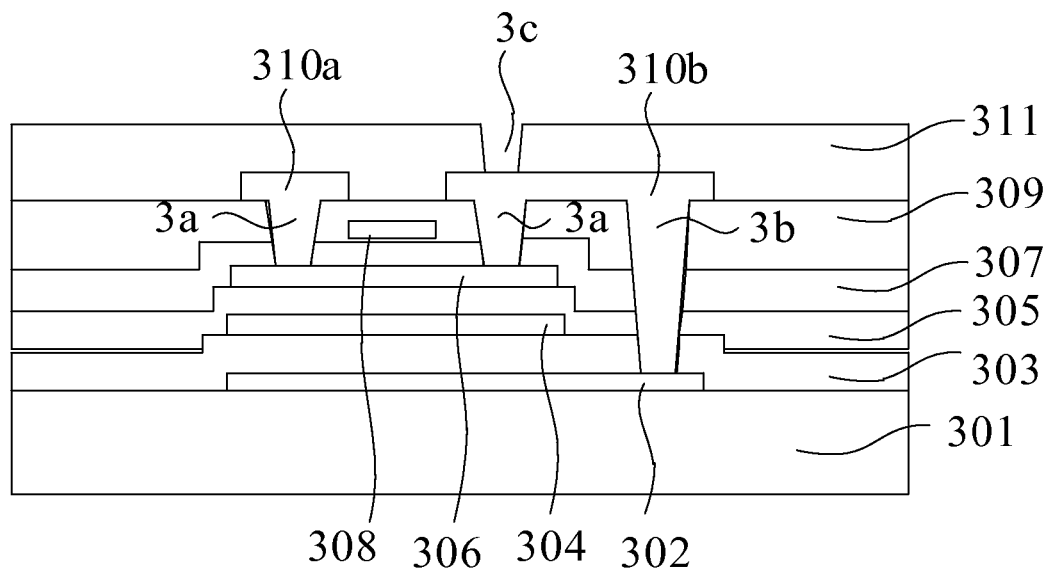
Figure 9L:
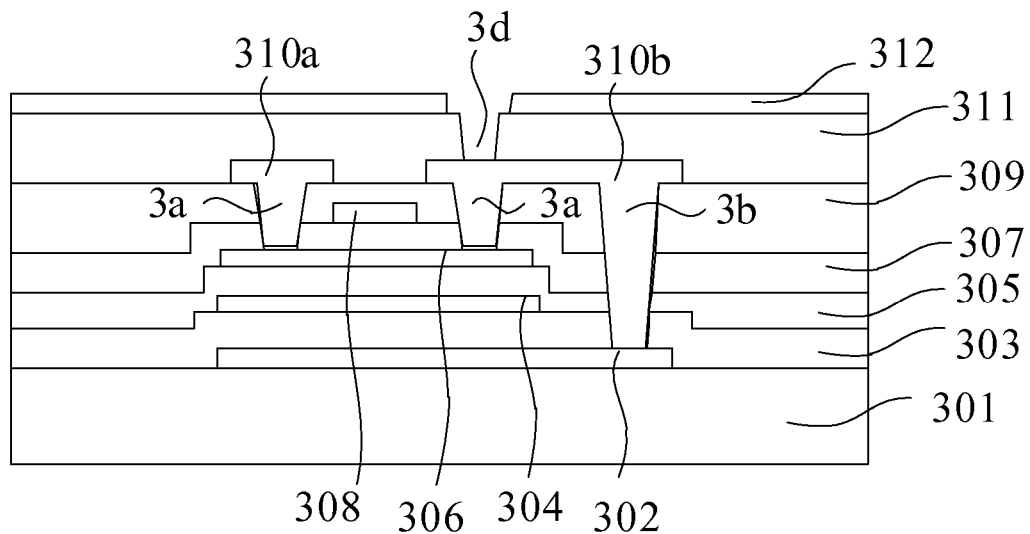
Figure 9M:
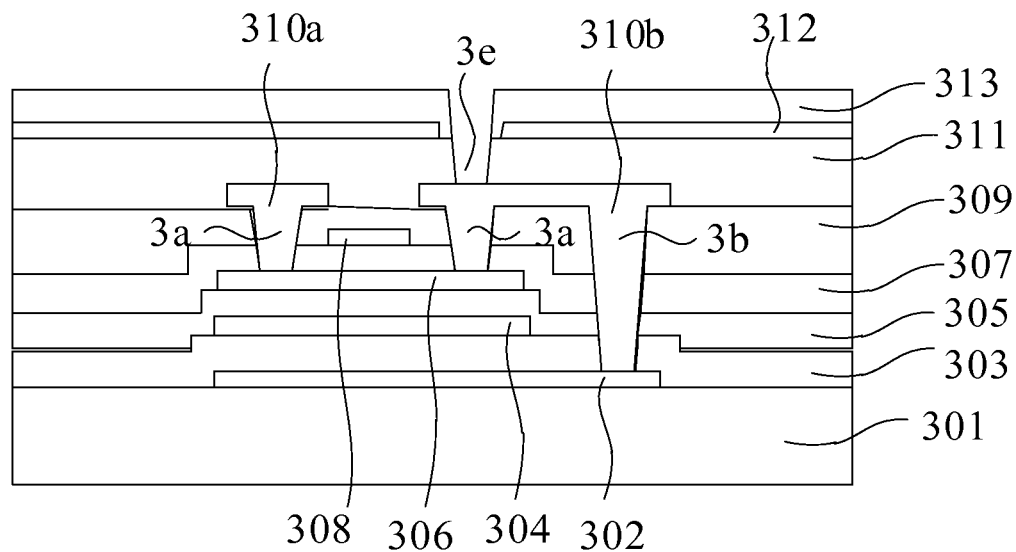
Figure 9N:
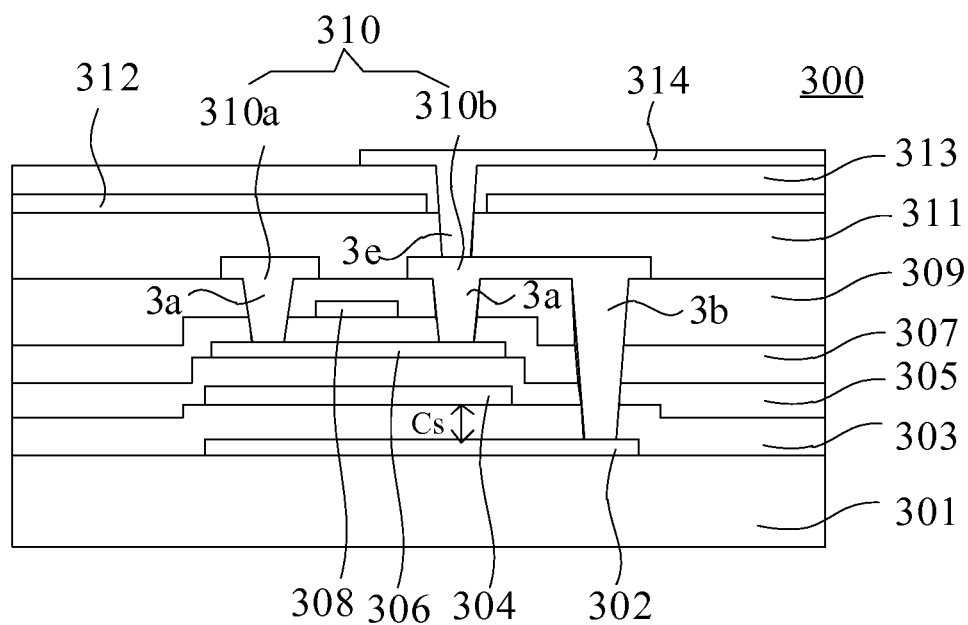

FIGS. 9A to 9N schematically illustrate cross-sectional views of intermediate structures of a method for forming an LTPS array substrate 300 according to an embodiment of the present disclosure.

Referring to FIG. 9A, a first substrate 301 is provided. In some embodiments, the first substrate 301 may be a transparent glass substrate. Referring to FIG. 9B, a first conductive layer 302 is formed on the first substrate 301, and is patterned. Referring to FIG. 9C, a first insulating layer 303 is formed on the first conductive layer 302 to cover the first conductive layer 302 and the first substrate 301. Referring to FIG. 9D, a second conductive layer 304 is formed on the first insulating layer 303, and is patterned. The first conductive layer 302 has a rectangular shape. The second conductive layer 304 has a shape of strip and a same electric potential with a common electrode. At least one of the first conductive layer 302 and the second conductive layer 304 includes a material capable of blocking lights, such as molybdenum-aluminum alloy, chromium, molybdenum or other materials which is conductive and capable of blocking lights. The material capable of blocking lights can prevent light emitted by a backlight unit from irradiating a trench layer, which avoids extra produced current. The projection of the second conductive layer 304 overlaps with the projection of the first conductive layer 302 on a vertical direction. The first conductive layer 302, the second conductive layer 304 and the first insulating layer 303 constitute a storage capacitance Cs.

Referring to FIG. 9E, a buffer layer 305 is formed on the second conductive layer 304 to cover the patterned second conductive layer 304 and the first insulating layer 303. A cleaning process may be performed before depositing the buffer layer 305. Afterwards, a PECVD process may be performed to form the buffer layer 305. Referring to FIG. 9F, amorphous silicon is deposited on the buffer layer 305 by a PECVD process, to form an amorphous silicon layer. In some embodiments, a high-temperature roaster may be used to perform a dehydrogenation process to the amorphous silicon layer, which may avoid hydrogen explosion during a crystallization process and reduce an inner defect density of a thin film after the crystallization process. After the dehydrogenation process, an LTPS process may be performed. Specifically, some crystallization methods, such as an ELA process, an MIC process or a SPC process, may be performed to the amorphous silicon layer to form a polysilicon layer on the buffer layer 305. Afterwards, different ion implantation regions may be formed on the polysilicon layer by exposure, and ions are injected into the polysilicon layer, to form a trench region and a source-drain region. Afterwards, the polysilicon layer is photoetched, to form a patterned polysilicon layer 306 on the buffer layer 305. The polysilicon layer 306 overlaps with the projection of the first conductive layer 302 and the projection of the second conductive layer 304 in the vertical direction. In some embodiments, at least one of the first conductive layer 302 and the second conductive layer 304 (opaque layers) entirely covers the polysilicon layer 306 in the vertical direction.

Referring FIG. 9G, a gate insulating layer 307 is formed on the patterned polysilicon layer 306 by a PECVD process, wherein the gate insulating layer 107 covers the patterned polysilicon layer 306 and the buffer layer 305. In some embodiments, the gate insulating layer 307 may include a dielectric material, such as a nitride-silicon compound or an oxygen-silicon compound. Referring to FIG. 9H, a gate metal layer is formed on the gate insulating layer 307 by a sputtering process, and a photoetching process is performed to the gate metal layer to form a gate 308 on the gate insulating layer 307. In some embodiments, the gate 308 may include a conductive material having a relatively low resistance, such as molybdenum-aluminum alloy, chromium or molybdenum. The gate 308 overlaps with the projection of the polysilicon layer 306, the projection of the first conductive layer 302 and the projection of the second conductive layer 304 in the vertical direction.

Referring to FIG. 9I, a dielectric layer 309 is formed on the gate 308 by a PECVD process, wherein the dielectric layer 309 covers the gate 308 and the gate insulating layer 307. In some embodiments, the dielectric layer 309 may include a dielectric material, such as a nitride-silicon compound or an oxygen-silicon compound. Two first vias 3a are formed by a dry etching process. The first vias 3a penetrate the dielectric layer 309 and the gate insulating layer 307, and expose a portion of the patterned polysilicon layer 306. A second via 3b is formed, which penetrates the dielectric layer 309, the gate insulating layer 307, the buffer layer 305 and the first insulating layer 303, and exposes a portion of the patterned first conductive layer 302.

Referring to FIG. 9J, a source-drain metal layer 310 is formed on the dielectric layer 309 by a sputtering process, and a photoetching process is performed on the source-drain metal layer 310 to form a source 310a which fills one first via 3a and a drain 310b which fills the other first via 3a and the second via 3b. The source-drain metal layer 310 may include a conductive material having a relatively low resistance, such as molybdenum-aluminum alloy, chromium or molybdenum. The source 310a and the drain 310b are electrically connected with the polysilicon layer 306 through the first vias 3a, and the drain 310b is further electrically connected with the first conductive layer 302 through the second via 3b. It should be noted that, in some embodiments, the source 310a and the drain 310b may exchange, and the position relation is not limited to FIG. 9J.

Referring to FIG. 9K, a planarization layer 311 is formed on the source 310a and the drain 310b, which covers the dielectric layer 309, the source 310a and the drain 310b. In some embodiments, the planarization layer 311 may include an organic film. A fourth via 3c whose position corresponds to that of the drain 310b is formed in the planarization layer 311. The fourth via 3c penetrates the planarization layer 311 and exposes a portion of the drain 310b. In some embodiments, an area of the fourth via 3c is greater than or equal to an area of the first via 3a which is filled with the drain 310b.

Referring to FIG. 9L, a first transparent electrode 312 is formed on the planarization layer 311 and etched to form a fifth via 3d whose position corresponds to that of the fourth via 3c and which exposes a portion of the planarization layer 311 and a portion of the drain 310b.

Referring to FIG. 9M, a second insulating layer 313 which serves as a protective layer is formed on the first transparent electrode 312 and in the fifth via 3d and the fourth via 3c by a PECVD process. In some embodiments, the second insulating layer 313 may have silicon nitride. Afterwards, a third via 3e which penetrates the second insulating layer 313 and the planarization layer 311 is formed by a dry etching process. The third via 3e exposes the drain 310b.

Referring to FIG. 9N, a second transparent electrode 314 is formed on the second insulating layer 313 and in the third via 3e by a sputtering process. The second transparent electrode 314 is connected with the drain 310b through the third via 3e, to form a pixel electrode.

Based on above steps, the LTPS array substrate 300 shown in FIG. 9N is formed. In the LTPS array substrate 300, the first conductive layer 302 and the second conductive layer 304 are formed on the first substrate 301, which are insulated from each other and stacked on the first substrate 301. The first conductive layer 302, the second conductive layer 304 and the first insulating layer 303 therebetween constitute the storage capacitance Cs. The storage capacitance Cs is disposed below a black matrix and has a relatively large area, thus, the storage capacitance Cs may account for about 50% of the whole pixel capacitance. That is, the storage capacitance Cs is increased at all possible without impacting an aperture ratio. Besides, in above embodiments, the common electrode (the second conductive layer 304) is formed under a conductive trench, which may shield the influence caused by exterior potential and avoid a startup of a back trench, such that a current leakage is reduced.

In an embodiment of the present disclosure, a displaying device is provided, including any one of the LTPS array substrates shown in FIGS. 1, 3 and 5. A structure and forming processes of the LTPS array substrate may be similar with above embodiments, and are not described in detail here.

In above embodiments, the LTPS array substrates and corresponding forming methods are described in detail. The principle and implementation methods of the present disclosure are described in conjunction with the detailed embodiments. The above description of the embodiments aims to help those skilled in the art to understand the spirit of the present disclosure. Those skilled in the art can modify and vary the embodiments in implementation ways and application ranges without departing from the spirit and scope of the present disclosure. Therefore, the present disclosure will not be limited to the above embodiments.

What is claimed is:

1. A low temperature poly-silicon (LTPS) array substrate, comprising:
    a first substrate having a first surface and a second surface opposite to the first surface;
    a first conductive layer and a second conductive layer over the first surface of the substrate, wherein the first and second conductive layers are insulated from each other and at least one of the first and second conductive layers comprises an opaque material;
    a polysilicon layer above the first and second conductive layers, wherein the polysilicon layer is shielded from backlight radiation from the substrate side by the opaque first or second conductive layer;
    an interlayer insulating layer above the polysilicon layer; and
    a metal layer on the interlayer insulating layer, wherein the metal layer comprises a source and a drain,
    wherein the source and the drain is each electrically connected with the polysilicon layer through a first via,
    wherein one of the source and the drain is electrically connected with the first conductive layer through a second via, and
    wherein the first conductive layer is disposed above the second conductive layer and the second conductive layer covers the entire first surface of the substrate.

2. The LTPS array substrate according to claim 1, wherein the first conductive layer has a rectangular shape, and the second conductive layer is transparent.

3. The LTPS array substrate according to claim 2, further comprising a first transparent electrode which is disposed above the metal layer and is electrically connected with the source or the drain through a third via.

4. The LTPS array substrate according to claim 3, further comprising a second transparent electrode which is disposed in a same layer as the first transparent electrode or is disposed between the first transparent electrode and the metal layer.

5. The LTPS array substrate according to claim 1, further comprising a first transparent electrode which is disposed above the metal layer and is electrically connected with the source or the drain through a third via.

6. The LTPS array substrate according to claim 5, further comprising a second transparent electrode which is disposed in a same layer as the first transparent electrode or is disposed between the first transparent electrode and the metal layer.

7. The LTPS array substrate according to claim 1, wherein the LTPS array substrate comprises a top gate or a bottom gate.

8. A displaying device, comprising a low temperature poly-silicon (LTPS) array substrate according to claim 1.

9. The LTPS array substrate according to claim 1, wherein the first and second conductive layers each comprise an opaque material.

\* \* \* \* \*